(12) United States Patent
Liaw

(10) Patent No.: US 7,660,149 B2
(45) Date of Patent: Feb. 9, 2010

(54) SRAM CELL WITH SEPARATE READ AND WRITE PORTS

(75) Inventor: Jhon-Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 76 days.

(21) Appl. No.: 11/636,014

(22) Filed: Dec. 7, 2006

(65) Prior Publication Data

US 2008/0137440 A1 Jun. 12, 2008

(51) Int. Cl.
*G11C 11/00* (2006.01)
(52) U.S. Cl. ...................................... 365/154
(58) Field of Classification Search ................ 365/154, 365/230.05
See application file for complete search history.

(56) References Cited

U.S. PATENT DOCUMENTS

| | | | | |
|---|---|---|---|---|
| 6,519,204 B2* | 2/2003 | Slamowitz et al. | ..... | 365/230.05 |
| 6,556,487 B1* | 4/2003 | Ratnakumar et al. | ... | 365/185.08 |
| 6,958,948 B2* | 10/2005 | Shiraishi | ................ | 365/230.05 |
| 7,136,296 B2* | 11/2006 | Luk et al. | .................... | 365/154 |
| 7,376,002 B2* | 5/2008 | Nii | .............................. | 365/154 |
| 2003/0002328 A1* | 1/2003 | Yamauchi | .................... | 365/154 |
| 2003/0107913 A1* | 6/2003 | Nii | .............................. | 365/154 |
| 2007/0279966 A1* | 12/2007 | Houston | ...................... | 365/154 |

* cited by examiner

*Primary Examiner*—Amir Zarabian
*Assistant Examiner*—Anthan T Tran
(74) *Attorney, Agent, or Firm*—K&L Gates LLP

(57) ABSTRACT

This invention discloses a dual port static random access memory (SRAM) cell, which comprises at least one inverter coupled between a positive supply voltage (Vcc) and a complementary low supply voltage (Vss) and having an input and an output terminals, at least one PMOS transistor with its gate, source and drain connected to the output terminal, Vcc and input terminal, respectively, a write port connected to the input terminal and having a write-word-line, a write-enable and a write-bit-line, and a read port connected to either the input or output terminal and having a read-word-line and a read-bit-line.

22 Claims, 6 Drawing Sheets

SRAM CELL WITH SEPARATE READ AND WRITE PORTS

BACKGROUND

The present invention relates generally to static random access memory (SRAM) cell, and, more particularly, to dual port SRAM cells.

Semiconductor memory devices include, for example, static random access memory, or SRAM, and dynamic random access memory, or DRAM. DRAM memory cell has only one transistor and one capacitor, so it provides a high degree of integration. But DRAM requires constant refreshing, its power consumption and slow speed limit its use mainly for computer main memories. The SRAM cell, on the other hand, is bi-stable, meaning it can maintain its state indefinitely as long as an adequate power is supplied. SRAM can operate at a higher speed and lower power dissipation, so computer cache memories use exclusively SRAMs. Other applications include embedded memories and networking equipment memories.

One well-known conventional structure of a SRAM cell is a six transistor (6T) cell that comprises six metal-oxide-semiconductor (MOS) transistors. Briefly, a 6T SRAM cell 100, as shown in FIG. 1, comprises two identical cross-coupled inverters 102 and 104 that form a latch circuit, i.e., one inverter's output connected to the other inverter's input. The latch circuit is connected between power and ground. Each inverter 102 or 104 comprises a NMOS pull-down transistor 115 or 125 and a PMOS pull-up transistor 110 or 120. The inverter's outputs serve as two storage nodes C and D, when one is pulled to low voltage, the other is pulled to high voltage. A complementary bit-line pair 150 and 155 is coupled to the pair of storage nodes C and D via a pair of pass-gate transistors 130 and 135, respectively. The gates of the pass-gate transistors 130 and 135 are commonly connected to a word-line 140. When the word-line voltage is switched to a system high voltage, or Vcc, the pass-gate transistors 130 and 135 are turned on to allow the storage nodes C and D to be accessible by the bit-line pair 150 and 155, respectively. When the word-line voltage is switched to a system low voltage, or Vss, the pass-gate transistors 130 and 135 are turned off and the storage nodes C and D are essentially isolated from the bit lines, although some leakage can occur. Nevertheless, as long as Vcc is maintained above a threshold, the state of the storage nodes C and D is maintained indefinitely.

Asynchronous multiprocessor systems require a means to transmit data between two independently running processors. Dual port memory provides a common memory accessible to both processors that can be used to share and transmit data and system status between the two processors. FIG. 2 shows a conventional eight-transistor (8-T) dual port SRAM cell 200. Essentially, it is a read port 202 added to the 6-T SRAM cell 100. The read port 202 comprises a read-port word-line 260, a read-port pass-gate NMOS transistor 270, a read-port pull-down NMOS transistor 275 and a read-port bit-line 280.

Referring to FIG. 2, the 6-T SRAM cell 100 can still perform read and write operations. The separate read port 202 can also perform read operation independent of the 6-T SRAM cell 100. So this cell can read data from cell 100 (pre-charging both bit-lines 250 and 255 to Vdd, and raising the voltage of gates 230 and 235 to high, then a sense-amplifier circuit detects a voltage difference between the bit-line pair 250 and 255), or from read port 202 (pre-charging a read-port bit-line 280 and raising the voltage of gate 260, then a sensing circuit detects the voltage at the read-port bit-line 280), or both cells 100 (to first circuit) and read port 202 (to second circuit). But during the data write cycle, only cell 100 is accessible.

Like the single-port 6-T SRAM cell, the conventional 8-T dual-port SRAM cell has a write disturb problem for the cells on the same word-line, which turns on all the pass-gate transistors thus exposes the storage nodes. Besides, the conventional 8-T dual-port SRAM cell has a large cell size due to eight transistors in total, and an additional read-port word-line and bit-line.

As such, what is desired is a SRAM cell that has the dual-port functionality while maintaining a relatively small cell size.

SUMMARY

This invention discloses a dual port static random access memory (SRAM) cell. According to one embodiment, the dual port SRAM cell comprises at least one inverter coupled between Vcc and Vss and having an input and an output terminals, at least one PMOS transistor with its gate, source and drain connected to the output terminal, Vcc and input terminal, respectively, a write-word-line, a write-enable and a write-bit-line, a first and a second switching devices connected in series between the input terminal and the write-bit-line, wherein a first control terminal of the first switching device is connected to the write-word-line and a second control terminal of the second switching device, which is connected to the write-enable, a read-word-line and a read-bit-line, and a third and a fourth switching devices connected in series between a supply voltage and the read-bit-line, wherein a third control terminal of the third switching device is connected to the read-word-line and a fourth control terminal of the fourth switching device is connected to either the input or output terminal.

According to another embodiment, the aforementioned write-word-line and read-word-line is one common word-line.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and are therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention discloses a 7-T SRAM cell with separate read and write ports and can serve in either single port or dual port SRAM.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
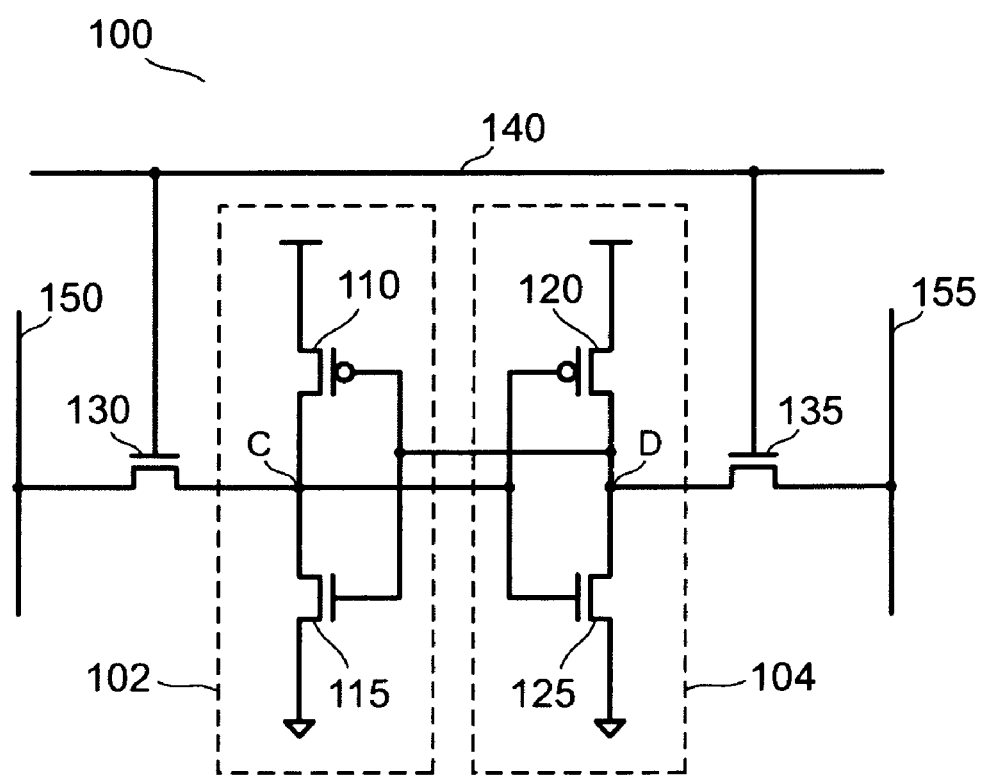
FIG. 1 is a schematic diagram illustrating a conventional 6-T SRAM cell.
Figure 2:
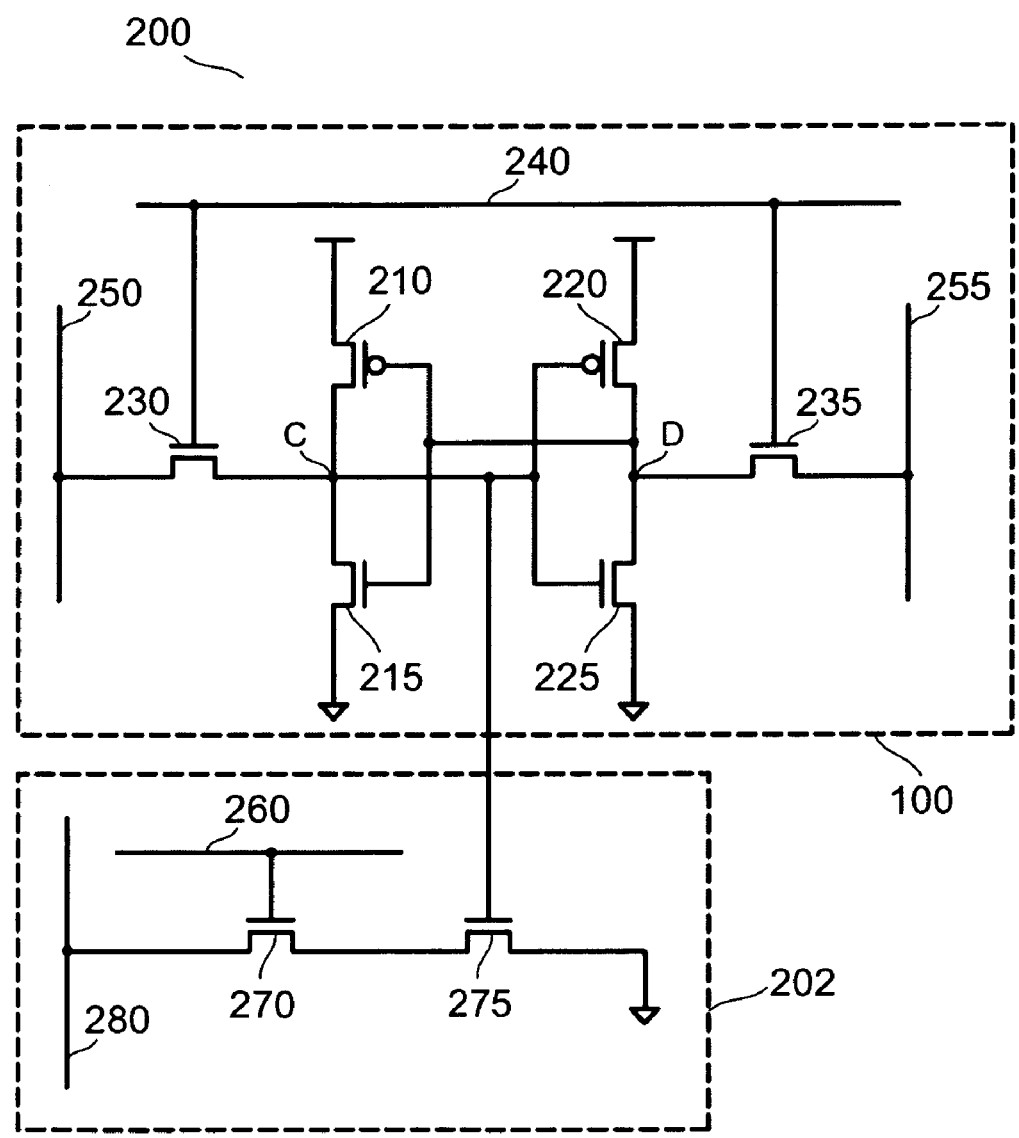
FIG. 2 is a schematic diagram illustrating a conventional 8-T dual-port SRAM cell.

FIGS. 1 and 2 have already been described and discussed as the relevant background to the present invention. They require no further discussion here.

Figure 3:
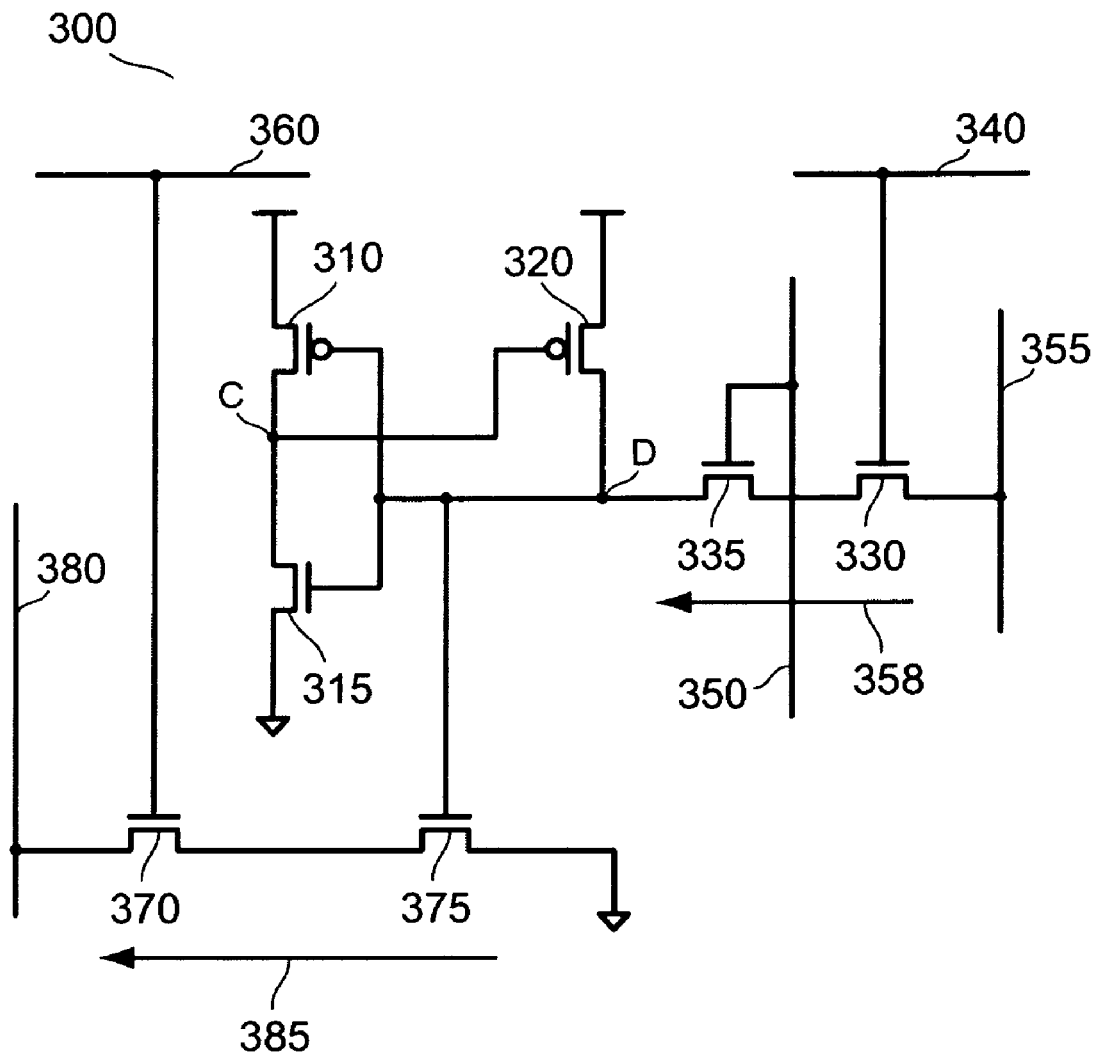
FIG. 3 is a schematic diagram illustrating a 7-T dual port SRAM cell according to one embodiment of the present invention.

FIG. 3 is a schematic diagram illustrating a 7-T dual port SRAM cell 300 according to one embodiment of the present invention. The 7-T dual port SRAM cell 300 comprises two pull-up PMOS transistors 310 and 320, one pull-down NMOS transistor 315. The PMOS transistor 310 and the NMOS transistor 315 forms an inverter with an input node D and an output node C connected to a drain and a gate of the PMOS transistor 320, respectively. The three transistors 310, 320 and 315 forms a storage core cell with nodes C and D as two storage nodes complimentary to each other, i.e., if node C is pulled up to a positive high voltage (Vcc), node D will be pulled down to a complementary low voltage (Vss).

Referring to FIG. 3, NMOS transistors 330 and 335 are connected in series, forming a write path 358 between a write-bit-line 355 and the storage node D. A source/drain of the NMOS transistor 335 is connected to node D, while a source/drain of the NMOS transistor 330 is connected to the write-bit-line 355. The write path 358 works just fine if the NMOS transistor 335 and the NMOS transistor 330 are switched placements, i.e., a source/drain of the NMOS transistor 335 is connected to the write-bit-line 355, while a source/drain of the NMOS transistor 330 is connected to node D (not shown). A gate of the NMOS transistor 330 is connected to a write-word-line 340. A gate of the NMOS transistor 335 is connected to a write-enable 350. Only when the write-word-line 340 turns to high voltage or "1", and the write-enable 350 turns to high voltage or "1", the write path 358 is activated, i.e., the write-bit-line 355 can write either a "1" or "0" into node D, otherwise the write path 358 is deactivated. If the write-word-line 340 is placed in row orientation, then the write-enable 350 is placed in column orientation, together they can address a particular cell in a memory array, without disturbing the rest of the cells. In essence, the transistors 330 and 335 are just two switches, and anyone of which can be either a NMOS or a PMOS transistor, though a NMOS is generally more preferable because it can deliver a higher current as a same size PMOS transistor, thus making a smaller cell size. If a NMOS is chosen, then its gate activation (turn-on) voltage is high. When a PMOS is chosen, then its gate activation voltage is low. Customarily, a signal line is named word-line when it is placed in row orientation, and that is why the write-word-line 340 is placed in row orientation as shown in FIG. 3. But this is just a naming convention, which has no bearing on the functions of the depicted circuits.

Referring to FIG. 3, node D of the SRAM cell 300 of the present invention has only a pull-up PMOS transistor 320 and no pull-down transistor. Node D can hold a "1" just as well as that of a conventional 6-T SRAM cell 100 shown in FIG. 1. But node D is relatively weak in holding a "0". After node D is written a "0", a sub-threshold leakage of the PMOS transistor 320 tends to pull node D to "1" over time. To compensate that sub-threshold leakage, the transistors 330 and 335 on the write path 358 are made leakier (higher sub-threshold leakage current) in their off state. One way to achieve this is to adjust the threshold voltage (Vt) of the transistors, so that absolute values of Vt of both the transistors 330 and 335 are lower than that of the PMOS transistor 320. At the same time, the write-bit-line 355 is forced to "0" during read or standby cycles. During write cycles, with both transistors 330 and 335 are 'on', if the write-bit-line is forced "1", then a "1" will be written to node D; and if the write-bit-line is forced "0", then a "0" will be written to node D. Node D voltage is always opposite to that of node C.

Referring to FIG. 3, similar to the write path 358, two serially connected NMOS transistors 370 and 375 form a read path 385 between a read-bit-line 380 and Vss. A gate and a source/drain of the NMOS transistor 370 are connected to a read-word-line 360 and a read-bit-line 380, respectively. The read-word-line 360 and read-bit-line 380 provide means to address any particular cells in the memory array, so that the NMOS transistor 370 serves as a read pass gate transistor. Customarily, the read-word-line 360 is placed in row-orientation, and the read-bit-line 380 is placed in column-orientation. A gate and a source of the NMOS transistor 375 are connected to node D and Vss, respectively. Prior to a read cycle, the read-bit-line is pre-charged to Vcc, and upon reading the SRAM cell 300, the read-word-line 360 rises to Vcc and turns on the NMOS transistor 370. If node D stores a "1", then the NMOS transistor 375 will be turned on, and the read-bit-line 380 will be pulled down to Vss. On the other hand, if node D stores a "0", then the NMOS transistor 375 will remain off, and the read-bit-line will remain in its pre-charged state. The voltage change or no change at the read-bit-line 380 will be detected by a sense amplifier (not shown) to interpret the stored state of the SRAM cell 300. The sense amplifier could take a reference bit-line from a dummy cell for comparing with the read-bit-line 380. A column of dummy cell can serve an entire memory array, with every SRAM cell has only one read-bit-line. Similarly, the placement of the NMOS transistors 370 and 375 along with their gate connections can be switched without affecting the read operation of the SRAM cell 300.

Similar to the write path 358, the transistors 370 and 375 are just two switches, and anyone of which can be either a NMOS or a PMOS transistor, though a NMOS is generally more preferable because it can deliver higher current as a same size PMOS transistor, thus makes a smaller cell size. If a NMOS is chosen, then its gate activation (turn-on) voltage is high. When a PMOS is chosen, then its gate activation voltage is low.

Referring to FIG. 3, since the read and write paths have their separate addressing word-lines and bit-lines, so that the 7-T SRAM cell can serve in a dual port SRAM memory, which allows simultaneous read and write operations.

Figure 4:
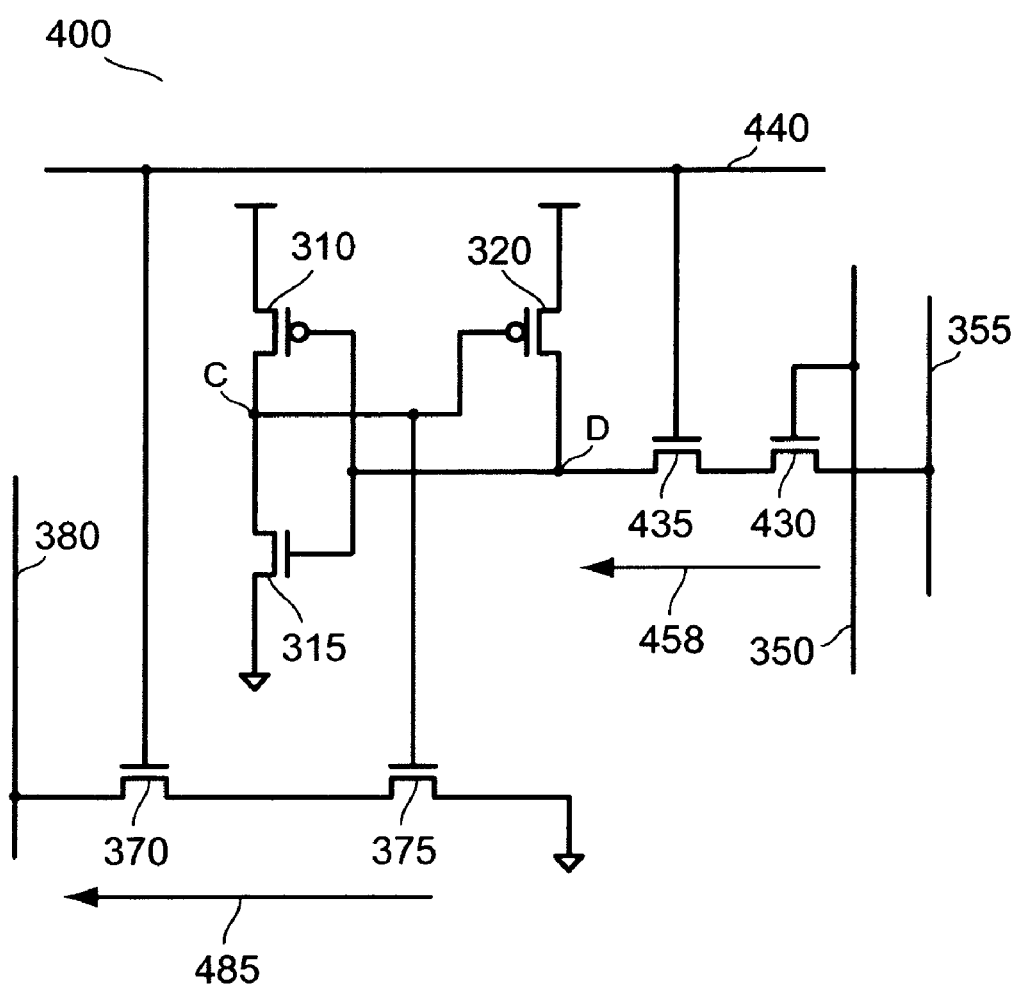
FIG. 4 is a schematic diagram illustrating a 7-T dual port SRAM cell according to another embodiment of the present invention.

FIG. 4 is a schematic diagram illustrating a 7-T dual port SRAM cell 400 according to another embodiment of the present invention. The SRAM cell 400 is a modified version of the SRAM cell 300. Here a NMOS transistor 430, a gate of which is connected to the write-enable 350, is placed next to the write-bit-line 355. A gate of a NMOS transistor 435 is connected to a word-line 440, which is also connected to the gate of the NMOS transistor 370 on the read path 385, i.e., the word-line 440 serves as a common word-line for both read and write. During read, the write-enable 350 will stay at "0", and turns off the NMOS transistor 430, so that the cell being read will not be disturbed by the NMOS transistor 435 on the write path 458 being turned on. On the other hand, during write, the NMOS transistor 370 on the read path 485 is turned on by the word-line, so that the read path 485 itself resembles a read operation, but as long as the corresponding sense amplifier is not enabled, this is just a dummy read.

Note in FIG. 4 that the gate of the NMOS transistor 375 is connected to node C instead of node D in SRAM cell 300 shown in FIG. 3. The SRAM cell 400 reads just the same as the SRAM cell 300, except the read-out polarity is reversed, which can be corrected at the sense amplifier or later in a corresponding data path. Also, as a result of only the gate of the NMOS transistor 375 is connected to the storage node C or D, reading the cell 300 or 400 has no disturbance on the charge stored in the storage node, thus dummy read is allowed. In such a way, only one word-line is needed, so that the memory array layout can be made more compact.

Figure 5:
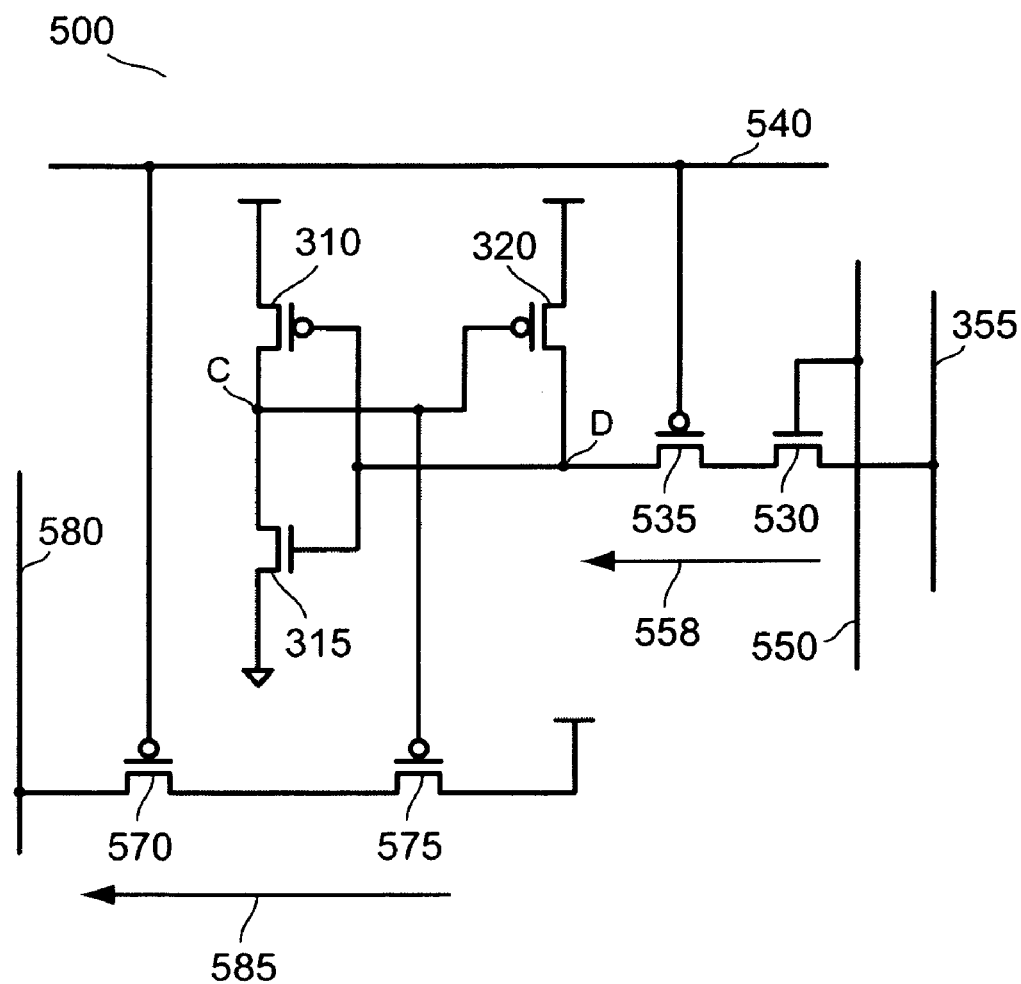
FIG. 5 is a schematic diagram illustrating a 7-T dual port SRAM cell according to yet another embodiment of the present invention.

FIG. 5 is a schematic diagram illustrating a 7-T dual port SRAM cell 500 according to yet another embodiment of the present invention. Here a read path 585 is formed by two serially connected PMOS transistors 570 and 575. A source of the PMOS transistor 575 is connected to Vcc. To select the SRAM cell 500, a word-line 540 is lowered to "0", which turns on PMOS transistors 570 and 535. The PMOS transistor 535 is on the write path 558. Prior to a read, the read-bit-line 580 is pulled-down to Vss. If the storage node C stores a "0", the PMOS transistor 575 will be turned on, and then the read-bit-line 580 will be pulled up by Vcc. If the storage node C stores a "1", the PMOS transistor 575 will be off, and then the read-bit-line 580 will remain at Vss. The voltage charge or no change will be detected by a sense amplifier to represent two states of the SRAM cell 500.

Referring to FIG. 5, a gate of a NMOS transistor 530 is connected to a write-enable 550, so that the write-enable 550 turns to "1" to enable a write to the SRAM cell 500.

Although the foregoing disclosures describe the SRAM cells used in a dual port application, giving the fact that the SRAM cell of the present invention employs only seven transistors, which is size competitive in comparison with the conventional 6-T single port SRAM cells, the 7-T SRAM cells can be used in single port SRAM applications.

Figure 6:
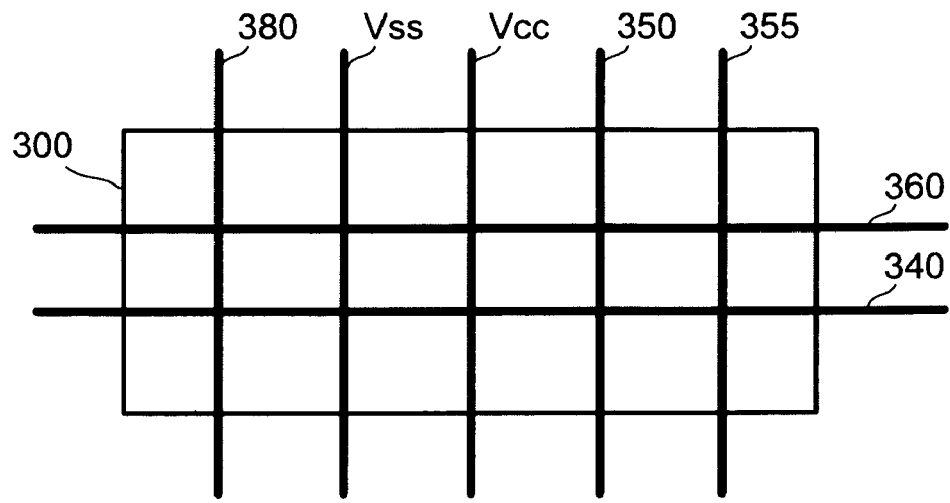
FIG. 6 is a diagram illustrating layout arrangement of the 7-T dual-port SRAM cell shown in FIG. 3.

FIG. 6 is a diagram illustrating a layout arrangement of the 7-T dual-port SRAM cell 300 shown in FIG. 3. Here the read-bit-line 380, Vss, Vcc, write-enable 350 and write-bit-line 355 are placed vertically. The separate write-word-line 340 and read-word-line 360 are placed horizontally.

Figure 7:
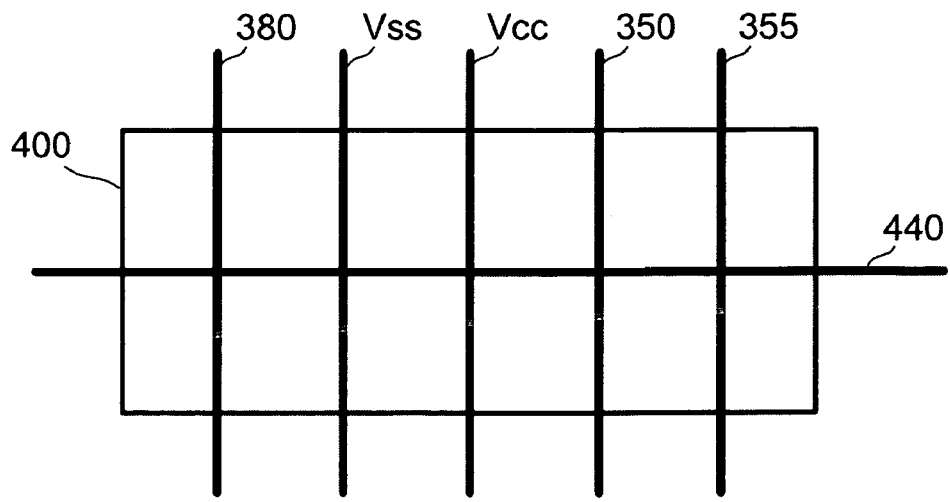
FIG. 7 is a diagram illustrating layout arrangement of the 7-T dual-port SRAM cell shown in FIG. 4.

FIG. 7 is a diagram illustrating a layout arrangement of the 7-T dual-port SRAM cell 400 shown in FIG. 4. Here the read-bit-line 380, Vss, Vcc, write-enable 350 and write-bit-line 355 are still placed vertically. But there is only one common word-line 440 for both read and write placed horizontally. The SRAM cell 500 shown in FIG. 5 can have an identical layout (not shown) as the SRAM cell 400, as they both have only one word-line.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A dual port static random access memory (SRAM) cell comprising:
   at least one inverter coupled between a positive supply voltage (Vcc) and a complementary low supply voltage (Vss) and having an input and output terminals;
   at least one PMOS transistor with its gate, source and drain connected to the output terminal, Vcc and input terminal, respectively;
   a write port connected to the input terminal and having a write-word-line, a write-enable and a write-bit-line, wherein the write port further comprises a first switching device and a second switching device connected in series between the input terminal and the write-bit-line; and
   a read port connected to either the input or output terminal and having a read-word-line and a read-bit-line, wherein the read port further comprises a first MOS transistor and a second MOS transistor connected in series between the read-bit-line and a supply voltage, wherein a gate of the first MOS transistor is connected to the read-word-line and a gate of the second MOS transistor is directly connected to the input or output terminal, and
   wherein the dual port SRAM cell is made of no more than seven transistors to reduce its cell size.

2. The dual port SRAM cell of claim 1, wherein a first control terminal of the first switching device is connected to the write-word-line and a second control terminal of the second switching device that is connected to the write-enable.

3. The dual port SRAM cell of claim 2, wherein the first switching device is a P-type or a N-type metal-oxide-semiconductor (PMOS or NMOS) transistor with its gate as the first control terminal.

4. The dual port SRAM cell of claim 2, wherein the second switching device is a PMOS or NMOS transistor with its gate as the second control terminal.

5. The dual port SRAM cell of claim 2, wherein the first switching device is connected to the input terminal while the second switching device is connected to the write-bit-line.

6. The dual port SRAM cell of claim 2, wherein the first switching device is connected to the write-bit-line while the second switching device is connected to the input terminal.

7. The dual port SRAM cell of claim 1, the first and second MOS transistors are N-type MOS transistors.

8. The dual port SRAM cell of claim 1, wherein the supply voltage is Vss or Vcc.

9. The dual port SRAM cell of claim 1, wherein the first MOS transistor is a first PMOS transistor with its gate connected to the read-word-line.

10. The dual port SRAM cell of claim 1, wherein the second MOS transistor is a second PMOS transistor with its gate connected to the input or output terminal.

11. The dual port SRAM cell of claim 1, wherein the first MOS transistor is connected to the read-bit-line while the second MOS transistor is connected to the supply voltage.

12. The dual port SRAM cell of claim 1, wherein the write-word-line and the read-word-line are a common word-line.

13. A dual port static random access memory (SRAM) cell comprising:
- at least one inverter coupled between Vcc and Vss and having an input and output terminals;
- at least one PMOS transistor with its gate, source and drain connected to the output terminal, Vcc and input terminal, respectively;
- a write-word-line, a write-enable and a write-bit-line;
- a first and a second switching devices connected in series between the input terminal and the write-bit-line, wherein a first control terminal of the first switching device is connected to the write-word-line and a second control terminal of the second switching device is connected to the write-enable;
- a read-word-line and a read-bit-line; and
- a third and a fourth switching devices connected in series between a supply voltage and the read-bit-line, wherein a third control terminal of the third switching device is connected to the read-word-line and a fourth control terminal of the fourth switching device is connected to either the input or output terminal, wherein the third and fourth switching devices are MOS transistors whose gates are directly connected to the read-word-line and the input or output terminal, respectively, and
- wherein the dual port SRAM cell is made of no more than seven transistors to reduce its cell size.

14. The dual port SRAM cell of claim 13, wherein the first switching device is a P-type or a N-type metal-oxide-semiconductor (PMOS or NMOS) transistor with its gate as the first control terminal.

15. The dual port SRAM cell of claim 13, wherein the second switching device is a P-type or a N-type metal-oxide-semiconductor (PMOS or NMOS) transistor with its gate as the second control terminal.

16. The dual port SRAM cell of claim 13, wherein the first switching device is connected to the input terminal while the second switching device is connected to the write-bit-line.

17. The dual port SRAM cell of claim 13, wherein the first switching device is connected to the write-bit-line while the second switching device is connected to the input terminal.

18. The dual port SRAM cell of claim 13, wherein the supply voltage is Vss or Vcc.

19. The dual port SRAM cell of claim 13, wherein the third switching device is an NMOS or a PMOS transistor with its gate as the third control terminal.

20. The dual port SRAM cell of claim 13, wherein the fourth switching device is an NMOS or a PMOS transistor with its gate as the fourth control terminal.

21. The dual port SRAM cell of claim 13, wherein the third switching device is connected to the read-bit-line while the fourth switching device is connected to the supply voltage.

22. The dual port SRAM cell of claim 13, wherein the write-word-line and the read-word-line are a common word-line.

\* \* \* \* \*